(12) United States Patent
Auerbacher

(10) Patent No.: US 10,983,175 B2
(45) Date of Patent: Apr. 20, 2021

(54) CONTACT ELEMENT ADAPTED FOR CONNECTION WITH OR WITHIN A TERMINAL MEASURING DEVICE, AND TERMINAL MEASURING SYSTEM

(71) Applicant: Rohde & Schwarz GmbH & Co. KG, Munich (DE)

(72) Inventor: Christian Auerbacher, Eggenthal (DE)

(73) Assignee: ROHDE & SCHWARZ GMBH & CO. KG, Munich (DE)

( * ) Notice: Subject to any disclaimer, the term of this patent is extended or adjusted under 35 U.S.C. 154(b) by 57 days.

(21) Appl. No.: 16/263,369

(22) Filed: Jan. 31, 2019

(65) Prior Publication Data

US 2020/0249265 A1 Aug. 6, 2020

(51) Int. Cl.
*G01R 31/69* (2020.01)
*H01R 24/40* (2011.01)

(52) U.S. Cl.
CPC ............ *G01R 31/69* (2020.01); *H01R 24/40* (2013.01)

(58) Field of Classification Search
CPC ............ G01R 33/286; G01R 1/07314; G01R 1/07371; G01R 1/44; G01R 33/34038; G01R 33/465; G01R 33/485; G01R 33/5601; G01R 3/00; G01R 31/69; H01R 4/60; H01R 43/002; H01R 24/40; B08B 1/00; B08B 9/00
See application file for complete search history.

(56) References Cited

U.S. PATENT DOCUMENTS

| | | | | |
|---|---|---|---|---|
| 2,766,440 A | * | 10/1956 | Marsden, Jr. | G08B 17/12 374/175 |
| 5,227,718 A | * | 7/1993 | Stowers | G01R 1/06722 324/72.5 |
| 5,277,496 A | * | 1/1994 | Mayer | G01J 5/0014 250/338.1 |
| 6,326,790 B1 | * | 12/2001 | Ott | G01V 3/15 324/236 |
| 6,836,129 B2 | * | 12/2004 | Lee | G01R 1/06772 324/690 |
| 7,227,624 B2 | * | 6/2007 | Fink | H01J 37/32862 118/712 |
| 7,555,190 B2 | * | 6/2009 | Iwazaki | G02B 6/3616 356/450 |
| 2012/0308839 A1 | * | 12/2012 | Chaumat | B23K 1/19 428/450 |
| 2014/0035591 A1 | * | 2/2014 | Mottes | G01N 33/24 324/347 |

* cited by examiner

*Primary Examiner* — Vinh P Nguyen

(74) *Attorney, Agent, or Firm* — Shumaker & Sieffert, P.A.

(57) ABSTRACT

A contact element adapted for connection with or within a terminal measuring device for inspecting terminal dimensions, comprising a contact head corresponding to and connectable to a terminal to be inspected, the contact head having a contact portion containing a technical ceramic for contacting the terminal to be inspected. The present invention also relates to a terminal measuring system comprising such contact element.

19 Claims, 5 Drawing Sheets

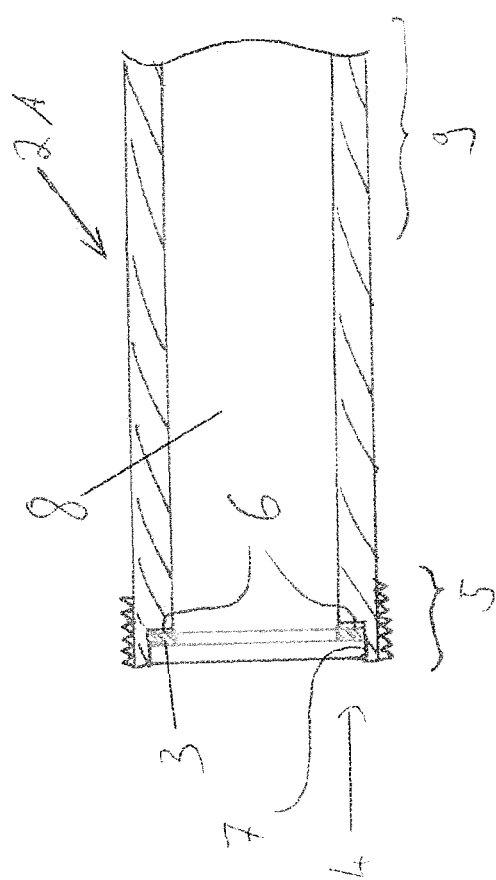

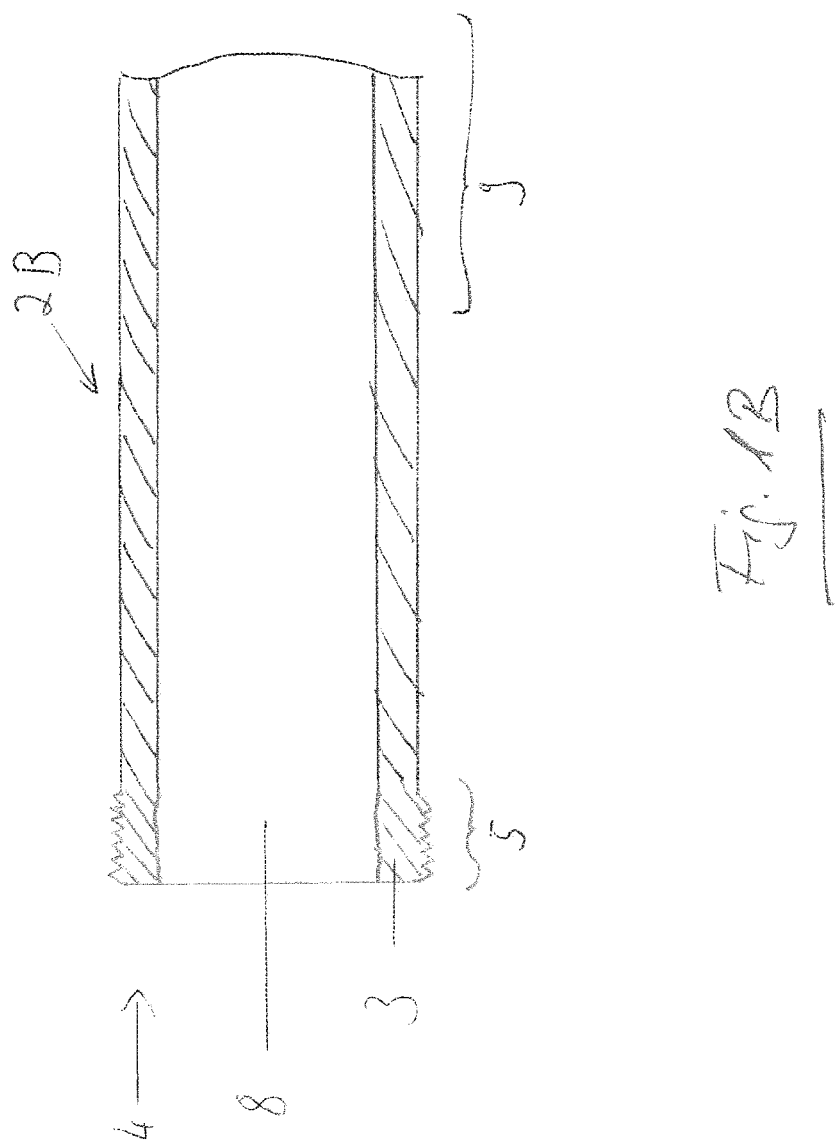

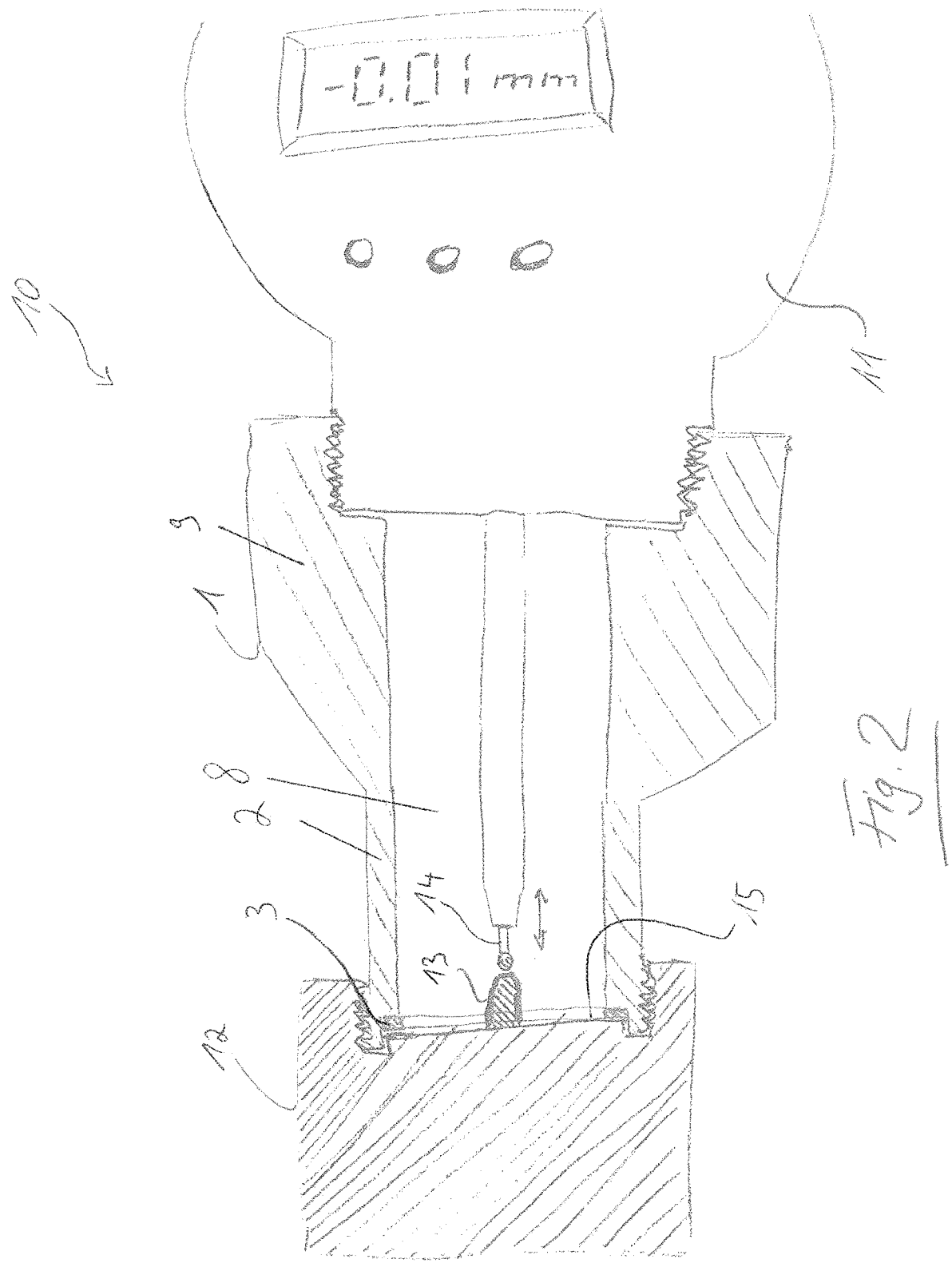

CONTACT ELEMENT ADAPTED FOR CONNECTION WITH OR WITHIN A TERMINAL MEASURING DEVICE, AND TERMINAL MEASURING SYSTEM

TECHNICAL FIELD

The present invention relates to a contact element adapted for connection with or within a terminal measuring device for inspecting terminal dimensions. The present invention further relates to a terminal measuring system, in particular for coaxial connections, using a contact element.

BACKGROUND ART

For inspection of terminal dimensions, in particular at HF connections which are usually configured as coaxial connections, dial gauges exist which are available from a large number of various manufacturers. Such dial gauges comprise a contact head made of metal by which particularly the inner conductor dimension of the connections may be inspected. A positive i.e. excessive inner conductor dimension could damage a mating connection or could cause contact problems and should therefore be avoided.

In order to precisely determine the dimensions of the inner conductor, it is necessary to have smooth, clean, and undamaged contact surfaces on these dial gauges and on the test objects to be inspected, since these contact surfaces are brought in contact with the end faces of the test objects and thus represent a reference surface for the measurement. A correct measurement therefore requires a proper contact between the contact surface of a dial gauge and the front surface of the test object.

However, modern HF connection systems often have very small terminal dimensions, for example a so called 1 mm system is now available. This makes it more and more difficult to achieve proper contacts for measuring the dimensions of a terminal connection. In particular, there is a risk that the contact surface of a dial gauge becomes deformed, worn off, damaged, or otherwise worn out without being noticed by a user such that the measurement results in an inaccurate reading.

SUMMARY OF THE INVENTION

In view of this background, it is an object of the present invention to provide an improved contact element adapted for connection with or within a terminal measuring device.

An aspect of the present invention provides a contact element and a terminal measurement system comprising the features of the independent patent claim.

Accordingly, it is provided:
A contact element adapted for connection with or within a terminal measuring device for inspecting terminal dimensions, comprising a contact head corresponding to and connectable to a terminal to be inspected, the contact head having a contact portion containing a technical ceramic for contacting the terminal to be inspected.
A terminal measuring system, in particular for coaxial connectors, comprising: a terminal measuring device and a contact element according to the present invention.

The present invention is based on the idea to form the contact surface of a contact element for a terminal measurement not completely of a metal, but of a material containing a technical ceramic material at least in a contact portion of the contact element. In particular, a contact portion of the contact element may be formed of a technical ceramic material, which is preferably free of metal. In this way, the contact surfaces are significantly harder than the metallic contact surfaces, and they are also corrosion and wear resistant. With such contact surfaces, there is therefore no wearing of the reference surface when performing a measurement for inspecting terminal dimensions, even when frequently used, such that permanently reproducible results may be achieved. Therefore, a constant quality of the inspection of terminal dimensions may be ensured.

The contact element according to the present invention may be part of a terminal measuring system, which is originally adapted in this way. A terminal measuring device may be detachably attached to the contact element for this purpose. The contact element then functions as an adapter between the measuring device and the terminal connection to be inspected.

However, it is also conceivable to provide a fixed or inseparable connection between the terminal measuring device and the contact element. The contact element may therefore also be provided as an inseparable part in the terminal measuring device, which in this case is particularly adapted for one type of connection.

In addition, the contact element according to the present invention may also be retrofitted modularly to existing connection and measuring devices. In this case it may replace existing contact elements, in particular metallic ones, for example when they are worn out. This also makes it possible to convert or retrofit existing terminal measuring systems by the contact element according to the present invention.

The contact portion containing a technical ceramic forms at least part of a contact surface or end face of the contact element that is brought in contact with a terminal.

Advantageous embodiments and further configurations result from the depending claims as well as from the description when taken in conjunction with the Figures of the drawing.

According to one embodiment, the technical ceramic is a non-oxide ceramic. In particular, the technical ceramic is based on compounds consisting of carbon, nitrogen, and/or silicon.

According to a further embodiment, the technical ceramic contains silicon carbide and/or silicon nitride.

According to a preferred embodiment, the contact portion is formed of silicon carbide or silicon nitride. In particular, the contact portion consists at least to a predominant extent of silicon carbide or silicon nitride ($Si_3N_4$). In particular, silicon carbide, at least in some preferred configurations such as silicon infiltrated silicon carbide (SiSiC) or pressureless sintered silicon carbide (SSiC), comprises significantly improved sliding properties than metals used in the prior art for such contact surfaces. Furthermore, such a contact portion may also be manufactured at relatively low manufacturing costs.

According to an embodiment, the contact head comprises an elongate recess, with the contact portion being positioned at an end face of the recess. In order to inspect the terminal dimension, a measuring probe of a terminal measuring device, for example a suitable dial gauge, is guided through the recess to inspect dimensions of an inner conductor. For example, the contact head comprises the shape of a hollow cylinder, with the contact portion being arranged on one end face of the hollow cylinder-type contact head.

In accordance with a preferred embodiment, the contact head is configured to correspond to an HF connection. In particular, the HF connection comprises a coaxial connection.

The HF connections may comprise a wide range of different connections or Standards for HF applications including 1.0/2.3, 1.6/5.6, 1 mm, 1.85 mm, 10-32 mm, 2.4 mm, 2.92 mm, 3.5 mm, ¾"-20, 4/13, DIN-7/16, A, B, Banana, BNC, BNC Twinax, C, D-Sub, Dezifix, E, F, FAKRA, FME, GR874, HN, I, IEC, K, LC, MC-Card, MCX, MHV, Mini SMB, Mini-SMP, Mini UHF, MCX, MMCX, Type N, PL, QN, QLF, QMA, QN, RCA, RP-SMA, SC, SHV, SMA, SMB, SMBA, SMC, SMP, SMS, SSMA, SSMB, SSMCX, TNC, TS-9 UHF, UMCX, V, W, WICLIC and so on.

The contact head preferably comprises a threaded portion for engagement with the corresponding thread of the HF connector. In this way, the contact head may be frictionally connected to the HF connection. To perform a measurement, the threads are screwed together until a contact surface of the contact portion is completely in contact with an end face of the terminal connection. In this way, a reference surface is formed for the measurement such that the terminal dimension may be inspected.

According to one embodiment, the contact head is made of a metal material and the contact portion is formed as a shoulder attached to it. In other words, the metal, which is easier to be machined, may be used for the configuration which corresponds to the terminal connection, and the very hard technical ceramic for the contact portion or its contact surfaces may be used in order to prevent wear.

According to one embodiment the contact portion is formed i.e. integrated into or screwed into the metallic contact head. In this way, the contact portion may easily be integrated into and attached within a metallic contact head.

According to another embodiment, the contact head comprises a circumferential groove in which the contact portion is slidably accommodated. The groove is provided directly at the recess, in particular on the front side. Alternatively or additionally the contact head may have a securing element to positively hold the contact portion. For example, a circlip may be provided for this purpose. In this way, the contact portion is easily detachably secured to the contact head.

According to another embodiment, the contact portion is interchangeably accommodated in the metallic contact head comprising various types of detachable receptacles, for example with a detachable circlip, thread or other detachable fastening means.

According to another embodiment, the contact head is at least to a predominant extent made of a technical ceramics material. The contact head therefore contains at least a substantial part of the technical ceramics material. In particular, the contact head is made of non-oxide ceramics, preferably silicon carbide or silicon nitride. The contact head preferably contains at least a substantial part of silicon carbide. The entire contact head is made of silicon carbide. Alternatively, the contact head may also be made of silicon nitride. In this way, the contact portion may be formed integrally with the contact head. In this case, the contact portion may itself form an end face of the contact head. In particular, the contact portion is an integral contact element which may be manufactured in one piece.

According to one embodiment the contact portion is made of reaction bonded silicon infiltrated silicon carbide, also referred to as SiSiC. Due to the production technology of silicon infiltration associated therewith, very precise dimensions may be produced without any shrinkage. In addition, this material comprises very high strength and corrosion resistance as well as high wear resistance. Alternatively or additionally, the contact portion may be made of pressureless sintered silicon carbide, also referred to as SSiC. This material has a particularly high wear resistance and a diamond-like hardness.

The above embodiments may be combined with each other in any sensible way. Further possible embodiments according to the present invention also include combinations of features of the present invention described above or in the following with respect to any configurations which are not explicitly mentioned. In particular, the skilled person may also add individual aspects as improvements or additions to the respective basic embodiment of the present invention.

BRIEF DESCRIPTION OF THE DRAWINGS

The present invention will be explained in more detail below using the examples given in the schematic Figures of the drawing, in which:

FIG. 1A is a schematic longitudinal sectional view of a contact head according to an embodiment;

FIG. 1B is a schematic longitudinal view of a contact head according to a further embodiment;

FIG. 2 is a schematic sectional view of a terminal measuring system;

Figure 3:
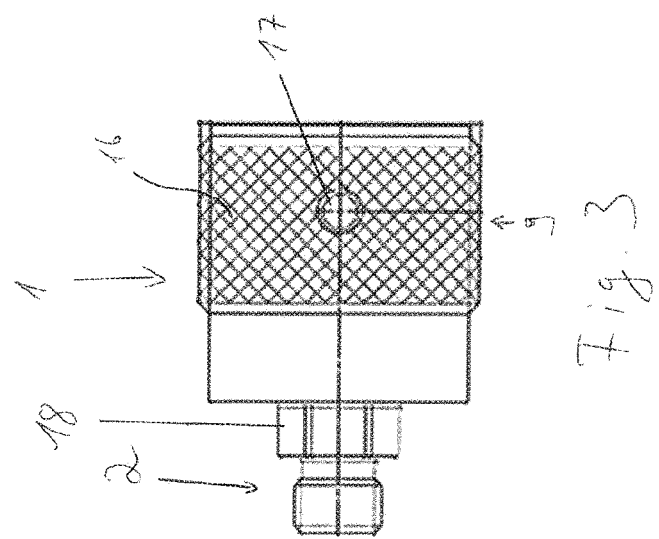
FIG. 3 A is a side view of a contact element according to an embodiment.

The enclosed Figures in the drawing are intended to provide a detailed understanding of the embodiments in which the invention was carried out. The enclosed Figures illustrate exemplary embodiments, and when taken in conjunction with the description they help to explain the principles and concepts of the present invention. Further embodiments and many of the advantages mentioned herein result from the drawings. The elements shown in the drawings are not necessarily drawn to scale.

In the Figures of the drawing, identical elements, features, and components having the same function and effect carry the same reference signs, unless otherwise specified.

DETAILED DESCRIPTION OF THE EMBODIMENTS

FIG. 1A shows a schematic longitudinal view of a contact head 2A according to an embodiment.

The contact head 2A shown represents a part of contact element 1, as explained in more detail with respect to FIG. 2. In the embodiment shown, the contact head 2A is adapted as a metallic hollow cylinder corresponding to a terminal connection 12 to be inspected. The contact head 2A thus has an elongate recess 8 extending axially there through.

In the embodiment shown, the contact head 2A comprises a threaded portion 5 in the form of an external thread on one end face 4, and a circumferential shoulder 6 for contacting one end face of a terminal connection to be inspected.

On the opposite side of contact head 2, there is a connecting portion 9, which is shown only partially, and which is adapted for attachment at or connection to a terminal measuring device 11.

At the end face 4 of the recess 8, which also forms an end face of the hollow cylindrical contact head 2, there is a contact portion 3. The contact portion is intended for contacting the terminal connection to be inspected.

For example, the contact portion may be used to be brought in contact with a coaxial connector, while the contact portion 3 forms the shoulder 6 for contacting the end face of the coaxial connector.

The contact head 2A thus forms a main body in the form of a metallic hollow cylinder in which the contact portion 3 is inserted into in the form of a ring.

Contact portion 3 is a circumferential ring made of silicon carbide which is inserted into a circumferential groove 7 at the transition between the end face 4 and the recess 8. The groove, on the other hand, forms a shoulder to support the ring.

The silicon carbide ring may be secured in the groove 7 with a circlip or other suitable securing means not shown in detail here. The securing means are arranged in such a way that they leave a contact surface of contact portion 3 which may be contacted with one end face of a terminal free. In addition, such a securing means may be detachable such that contact portion 3 is interchangeable depending on the application.

The silicon carbide material is reaction-bonded silicon infiltrated silicon carbide (SiSiC) or pressureless sintered silicon carbide (SSiC). Instead of silicon carbide, the use of other technical ceramics, preferably other non-oxide ceramics such as silicon nitride (Si3N4), is conceivable for the formation of contact portion 3.

FIG. 1B shows a schematic longitudinal view of a contact head 2B according to another embodiment. The embodiment shown in FIG. 1B differs essentially in the material used for the contact head 2B, which is also made of silicon carbide. Accordingly, the contact portion 3 on the face 4 of the recess 8 is formed integrally with the contact head 2B and forms part of the face 4.

The external thread of the threaded portion 5 is shown here as being formed in the silicon carbide contact head 2, as an example. However, it would also be conceivable to put a threaded sleeve on the outside of the contact head, such that the threaded portion 5 may be manufactured easily.

Other technical ceramics materials, in particular other non-oxide ceramics such as silicon nitride, are also conceivable herein as an alternative to silicon carbide. Furthermore, it is conceivable that only the area of the contact portion of the contact head may be made of silicon carbide.

FIG. 2 shows a schematic sectional view of a terminal measuring system 10. The terminal measuring system 10 comprises a terminal measuring device 11, which is configured herein as a so called dial gauge. Such dial gauges exist from various manufacturers, for example Maury Microwave Inc., and are supplied with various metallic contact elements suitable for various types of connections. For example, a set of such dial gauges with contact elements for different connections has been distributed by the manufacturer mentioned above under the name "SMA Precision Connector Gage Kit A027 Series".

The terminal measuring system according to the present invention comprises—in addition to such a terminal measuring device 11—a contact element 1 according to the present invention. The connecting portion 9 of the contact element 1 in the embodiment shown here is formed exemplarily with a diameter adjustment in the form of a widening and a threaded hole with an internal thread which is larger than the recess 8 and is screwed to an external thread of the terminal measuring device 11. In this way, the terminal measuring device 11 and the contact element 1 are connected to each other.

Contact element 1 may thus be attached to existing terminal measuring devices via connecting portion 9. Of course, the connecting portion 9 may be adapted to other configurations of a terminal measuring device 11, and may therefore be adapted in various ways for different types of a terminal measuring device 11.

Contact element 1 may therefore be retrofitted as a modular unit for various connection and measuring devices. In addition, it is also conceivable that contact element 1 and a terminal measuring device 11 may be permanently or inseparably coupled with each other, or integrally formed with each other in other configurations.

In addition to the terminal measuring system 10, a terminal connection 12 to be inspected is schematically shown in FIG. 2, as an example of a coaxial connection having an internal thread corresponding to the threaded portion 5.

In addition, terminal 12 has an inner conductor 13, wherein the inner conductor dimension of which is probed by a measuring probe 14 extending from the measuring device 11 through the recess 8 of the contact head 2. A reference i.e. reference surface of the measurement forms a contact surface between the contact portion 3 and an end surface 15 of the terminal 12. With the contact portion 3 being made of a technical ceramics material, preferably silicon carbide, a very high wear resistance is provided at the contact surface, such that the reference with respect to the measuring device remains exactly the same even when used a number of times.

Still with respect to FIG. 2, as indicated by the arrow next to the sensor 14, the position of the inner conductor 13 is measured in the depth direction from the reference surface formed by the contact portion 3 and the end face 15 of the connection. There is a maximum dimension to which the terminal measuring device 11 is calibrated, in the example shown having the value 0. If a slightly negative dimension, in the given example a hundredth of a millimeter, is measured within a predetermined tolerance, the inner conductor dimension is in the nominal range. However, if a positive value is reached, the measurement result is outside the permissible range, such that the connection must be reworked in order to avoid subsequent contacting difficulties or damage to a connector connected to terminal connection 12.

Connection 12 may, for example, be an HF connection for a measuring device to which a test object will be connected.

FIG. 3 shows a side view of a contact element 1 according to an embodiment of the present invention. As shown, contact element 1 is formed as a metallic part, in particular a turned part, comprising several steps. Further intermediate steps are provided between contact head 2 and connecting portion 9.

In FIG. 3 on the right hand side, the connecting portion 9 is shown, which is provided on its outer surface with a corrugated surface 16 in order to facilitate attaching the contact element by hand on a dial gauge or other terminal measuring device 11. Connecting portion 9 also has a tapped hole 17 which extends radially to a central axis of contact element 1, and is intended to receive a fixing screw for attachment to a measuring device 11.

Figure 4:
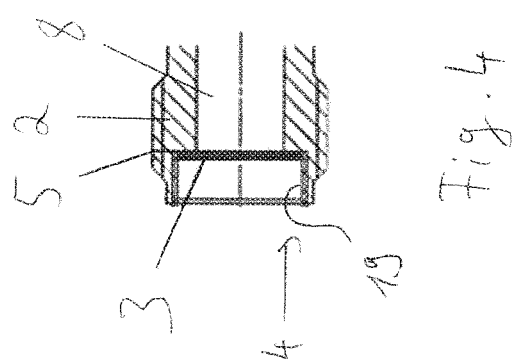
FIG. 4 is a longitudinal sectional view in the area of the contact head of the contact element of FIG. 3.

In FIG. 3 on the left hand side, the contact head 2 of contact element 1 is positioned, which is discussed in more detail with respect to FIG. 4.

Between the contact head 2 and the connecting portion 9, a tool fitting 18 is provided, which is formed in a hexagon shape, as an example. By means of the tool fitting 18 the contact head 2 may be screwed into a connection to be inspected, and/or a screw connection of the contact head 2 with the connection may be detached after the measurement.

A further shoulder is provided between the tool fitting 18 and the connecting portion 9, which serves in particular for an adjustment in diameter.

FIG. 4 shows a longitudinal sectional view depicting the contact head 2 of contact element 1 of FIG. 3. As explained with respect to FIG. 1A, a ring-shaped contact portion 3 is inserted into the contact head 2 at one end 4 of the recess 8. In this embodiment, instead of a circumferential groove 7, an internal thread 19 is provided at the transition between the end face and recess 8 to secure the contact portion 3 within contact head 2. For securing, the contact portion 3 may either have itself an external thread which may be screwed into the internal thread 19, or may be secured by a threaded sleeve (not shown here) which may be screwed into the internal thread 19.

In addition, the contact head 2 shown also has a threaded portion 5 with an external thread for screwing into a connection to be inspected.

Figure 5:
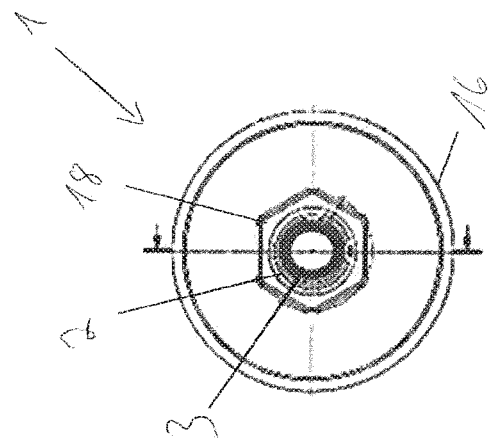
FIG. 5 is a front view of the contact element of FIG. 3.

FIG. 5 shows a front view of contact element 1 of FIG. 3. FIG. 5 shows the rotationally symmetrical implementation of contact element 1 as a turned part. The only difference is the tool fitting 18, which is subsequently formed in a hexagon shape.

Also shown in FIG. 5 is a front contact surface of contact portion 3 which is brought into contact with an end face of a terminal to perform a terminal dimension inspection when the threaded portion 5 is screwed into an internal thread of the terminal.

Figure 6:
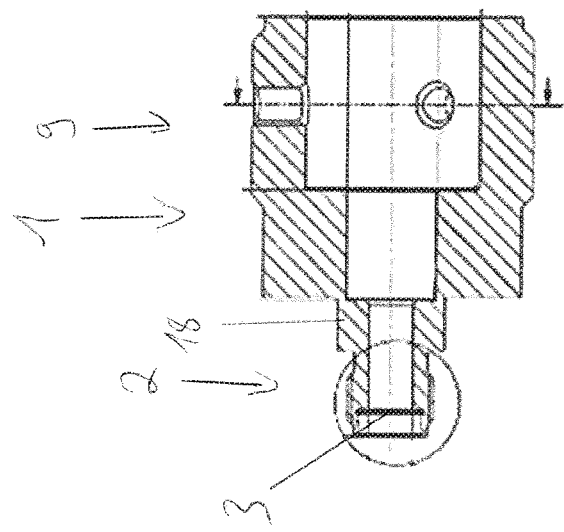
FIG. 6 is a longitudinal view of the contact element of FIG. 5.

FIG. 6 shows a longitudinal view of contact element 1 of FIG. 5. With respect to FIG. 6, not only the different steps of the outer diameter explained with reference to FIG. 3 are visible but also different steps of the inner diameter of contact element 1 are visible. In the area of connecting portion 9, a relatively large inner diameter is provided for inserting the measuring device, while an inner diameter in the area of the contact head 2 and the tool shoulder 18 is relatively small. A portion having an intermediate inner diameter is therefore provided between the tool fitting 18 and the connecting portion 9 for an adjustment in diameter.

For a detailed understanding, FIG. 4 is an enlarged illustration of the circle surrounding the contact head 2 shown in FIG. 6.

Figure 7:
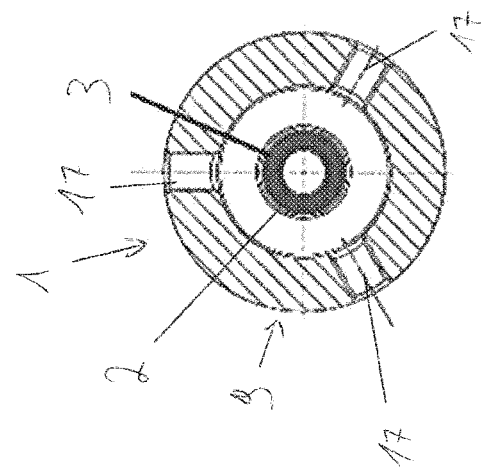
FIG. 7 is a cross-sectional view of the contact element of FIG. 6.

FIG. 7 shows a cross-sectional view of contact element 1 of FIG. 6. This view shows the uniform distribution of three tapped holes 17 over the circumference of the connecting portion 9 for attaching the contact element 1 to a terminal measuring device 11. Such radially arranged holes may also be used to center the contact element with respect to the measuring device 11.

Although the present invention has been fully described above using preferred exemplary embodiments, the present invention is not limited by the exemplary embodiments, but may be modified in a variety of ways. In particular, in addition to coaxial connections, other types of connections may also be inspected by using the contact head adapted appropriately and thus being connectable therewith.

REFERENCE SIGNS LIST

1 Contact element
2 Contact head
2A Contact head
2B Contact head
3 Contact portion
4 Front side
5 Threaded portion
6 Shoulder
7 Groove
8 Recess
9 Connecting portion
10 Terminal measuring system
11 Terminal measuring device
12 Terminal
13 Inner conductor
14 Measuring probe
15 Front surface
16 Corrugated surface
17 Threaded bore hole
18 Tool fitting
19 Inner thread

The invention claimed is:

1. A contact element adapted for connection with or within a terminal measuring device for inspecting terminal dimensions, wherein the contact element comprises:
   a contact head corresponding to and connectable to a terminal to be inspected, the contact head having a contact portion at an end face of the contact head,
      wherein the contact portion comprises a technical ceramic for contacting the terminal to be inspected,
      wherein the contact portion is inserted into the contact head at the end face thereof in the form of a ring, and
      wherein the contact portion comprises a contact surface which is adapted to be brought completely in contact with an end face of the terminal by screw engagement such that a reference surface is formed for performing a measurement of the terminal dimensions.

2. The contact element according to claim 1, wherein the technical ceramic comprises a non-oxide ceramic.

3. The contact element according to claim 1, wherein the technical ceramic comprises silicon carbide.

4. The contact element according to claim 1, wherein the technical ceramic comprises silicon nitride.

5. The contact element according to claim 1, wherein the contact portion is made of silicon carbide or silicon nitride.

6. The contact element according to claim 1, wherein the contact head is substantially made of the technical ceramic, and the contact portion is formed in one piece with the contact head.

7. The contact element according to claim 1, wherein the contact head has an elongate recess, and wherein the contact portion is arranged at an end face of the recess.

8. The contact element according to claim 1, wherein the contact head is adapted to correspond to an HF connection or coaxial connection.

9. The contact element according to claim 8, wherein the contact head comprises a threaded portion for screwing into a corresponding thread of the HF connection.

10. The contact element according to claim 1, wherein the contact head is made of a metal and the contact portion is formed as a shoulder attached thereto.

11. The contact element according to claim 10, wherein the contact portion is formed or screwed into the metallic contact head.

12. The contact element according to claim 10, wherein the contact portion is interchangeably accommodated in the metallic contact head.

13. The contact element according to claim 1, wherein the contact head has a circumferential groove, the groove configured to slidably accommodate and positively engage with the contact portion.

14. The contact element according to claim 1, wherein the contact head has a retaining element or a retaining ring for positive engagement with the contact portion.

15. The contact element according to claim 12, wherein the retaining element is adapted as a circlip.

16. The contact element according to claim 1, wherein the contact portion is formed of reaction-bonded silicon infiltrated silicon carbide.

17. The contact element according to claim 1, wherein the contact portion is formed of pressureless sintered silicon carbide.

18. A terminal measuring system, comprising:
   a terminal measuring device; and
   at least one contact element for inspecting terminal dimensions, the contact element comprising a contact head which is adapted to correspond to a terminal to be inspected and is connectable thereto,
   the contact head having a contact portion at an end face of the contact head,
   wherein the contact portion comprises a technical ceramic for contacting the terminal to be inspected,
   wherein the contact portion is inserted into the contact head at the end face thereof in the form of a ring, and
   wherein the contact portion comprises a contact surface which is adapted to be brought completely in contact with an end face of the terminal by screw engagement such that a reference surface is formed for performing a measurement of the terminal dimensions.

19. The terminal measuring system according to claim 18, wherein the terminal measuring system is adapted for connections adapted as coaxial connections.

\* \* \* \* \*